United States Patent
Chuang et al.

(10) Patent No.: US 6,798,682 B2
(45) Date of Patent: Sep. 28, 2004

(54) REDUCED INTEGRATED CIRCUIT CHIP LEAKAGE AND METHOD OF REDUCING LEAKAGE

(75) Inventors: Ching-Te K. Chuang, South Salem, NY (US); Rajiv V. Joshi, Yorktown Heights, NY (US); Michael G. Rosenfield, Austin, TX (US)

(73) Assignee: International Business Machines Corp., Armonk, NY (US)

( * ) Notice: Subject to any disclaimer, the term of this patent is extended or adjusted under 35 U.S.C. 154(b) by 15 days.

(21) Appl. No.: 10/307,168

(22) Filed: Nov. 29, 2002

(65) Prior Publication Data

US 2004/0105300 A1 Jun. 3, 2004

(51) Int. Cl.[7] ............................................. G11C 11/413
(52) U.S. Cl. .................. 365/63; 365/185.24; 365/185.1; 365/226
(58) Field of Search .................... 365/185.24, 185.1, 365/63, 226

(56) References Cited

U.S. PATENT DOCUMENTS

| | | | |
|---|---|---|---|
| 6,515,521 B2 * | 2/2003 | Kono et al. .................. | 327/108 |
| 6,534,807 B2 * | 3/2003 | Mandelman et al. ........ | 257/272 |
| 6,677,780 B2 * | 1/2004 | Tanaka et al. ............... | 326/62 |
| 6,683,805 B2 * | 1/2004 | Joshi et al. .................. | 365/156 |
| 2003/0147272 A1 * | 8/2003 | Joshi et al. .................. | 365/156 |

* cited by examiner

*Primary Examiner*—Viet Q. Nguyen
(74) *Attorney, Agent, or Firm*—Law Office of Charles W. Peterson, Jr.; Louis J. Percello

(57) ABSTRACT

An integrated circuit that may include an array such as a static random access memory (SRAM) with high threshold device array devices and in selected other devices to reduce leakage. Devices with high threshold have a thicker gate oxide or a high k dielectric gate oxide that is selected based on threshold voltage ($V_T$) variations with gate oxide dielectric type or gate oxide thickness for the particular technology, e.g., PD SOI CMOS. High threshold devices may be used in non-core circuits, e.g., test circuits. Also, non-critical paths may be identified and a non-critical path margin identified. A thicker device threshold is selected for non-critcal path FETs based on the non-critical path margin. Non-critical path delays are re-checked. FETs are formed with the selected thicker gate oxide for any non-critical paths passing the re-check and in array FETs with non-selected FETs being formed with normal gate oxide thickness.

33 Claims, 3 Drawing Sheets

REDUCED INTEGRATED CIRCUIT CHIP LEAKAGE AND METHOD OF REDUCING LEAKAGE

BACKGROUND OF THE INVENTION

1. Field of the Invention

The present invention is related to integrated circuit power consumption and more particularly to reducing static random access memory (SRAM) power consumption.

2. Background Description

Semiconductor technology and chip manufacturing advances have resulted in a steady increase of on-chip clock frequencies, the number of transistors on a single chip and the die size itself, coupled with a corresponding decrease in chip supply voltage and chip feature size. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, net power consumption reduction is important but, without degrading performance below acceptable levels.

To minimize power consumption, most integrated circuits (ICs) used in such low end systems (and elsewhere) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa.

For example, a CMOS inverter is a series connected PFET and NFET pair that are connected between a power supply voltage ($V_{dd}$) and ground (GND). Both are gated by the same input and both drive the same output, the PFET pulling the output high and the NFET pulling the output low at opposite input signal states. Ideally, when the gate of a NFET is below some positive threshold voltage ($V_T$) with respect to its source, the NFET is off, i.e., the switch is open. Above $V_T$, the NFET is on conducting current, i.e., the switch is closed. Similarly, a PFET is off when its gate is above its $V_T$, i.e., less negative, and on below $V_T$. Thus, ideally, the CMOS inverter in particular and CMOS circuits in general pass no static (DC) current. So, ideal CMOS circuits use no static or DC power and only consume transient power from charging and discharging capacitive loads.

In practice however, transient power for circuit loads accounts for only a portion of the power consumed by CMOS circuits. A typical FET is much more complex than a switch. FET drain to source current (and so, power consumed) is dependent upon circuit conditions and device voltages. FETs are known to conduct what is known as subthreshold current below threshold for NFETs and above for PFETs. Subthreshold current increases with the magnitude of the device's drain to source voltage ($V_{ds}$) and inversely with the magnitude of the device $V_T$. Among other things, $V_T$ is inversely proportional to gate oxide thickness and, to some extent channel length, both of which are related to feature size. In addition, gate leakage, to channel, to source or drain and gate induced drain leakage (GIDL) can also contribute to static power and are also related in particular to oxide thickness. Thus, as chip features shrink, these leakage sources become more predominant. This is especially true in what is known as partially depleted (PD) silicon on insulator (SOI) technology, where subthreshold leakage has been shown to increase dramatically, such that it may be the dominant source of leakage. When multiplied by the millions and even billions of devices on a state of the art IC, even 10 picoAmps (100 pA) of leakage in each devices, for example results in chip leakage on the order of 100 milliAmps (100 mA).

For logic chips such as general and special purpose processors, non-load related power dissipation is fairly randomly distributed throughout the logic. Transient power tends to dominate logic chip power consumption. Arrays, however, such as random access memories (RAMs) and especially static RAMs (SRAMs), have a large areas that may remain dormant during any one operation. Thus, in these dormant areas, leakage can become a substantial source of power consumption and is nearly the sole source of standby power consumption.

A typical SRAM array is an array of SRAM cells that are each essentially a pair of cross-coupled inverters selectively couple to a pair of complementary bit lines by a pair of pass gates or word line devices. Typically, the cells may be organized n word lines by m bit lines (complementary bit line pairs) by k bits. So, accessing one bit from one of the k (or more) subarrays entails selecting one of the n word lines. Of the m cells partially selected by that word line, only one (on one of the m bit lines) may actually be accessed. During a read, each of the bit line pairs rises/droops only to develop enough signal (e.g., 50 mV) for a sense amplifier. During a write, the pair for the cell being accessed may be driven at least what is termed "rail to rail," i.e., to opposite extremes ($V_{dd}$ and GND) and for a short period of time, a portion of those write voltages are passed to the cell. Then, the word line drops isolating the cell from the bit line and, the cell completes latching what was written.

It is well known that any mismatch in the cross coupled inverters, whether inverter load, in inverter devices or layout can introduce cell sensitivities or noise that causes the cell to favor one state over the other. These cell sensitivities can impair cell performance, cell reliability and in the extreme render the RAM useless. Therefore, typically cell designers strive to design perfectly balanced cells.

Since low end systems may include several chips, it is important to reduce power in each. However, typically, memory accounts for a large number of those chips. Especially with low end systems those memory chips are SRAM. So, SRAM chip power is multiplied by the number of SRAM chips included. While high chip power may be tolerable for a single (e.g., processor) chip, when multiplied by a number SRAM chips it can account for a significant portion of system power, making the difference between acceptable and unacceptable system battery life. Thus, SRAM design and especially, SRAM cell designers must balance power consumption concerns and especially leakage with performance.

Thus, there is a need for reduced SRAM chip power consumption.

SUMMARY OF THE INVENTION

It is a purpose of the invention to reduce integrated circuit power consumption without impacting circuit performance;

It is another purpose of the invention to reduce SRAM power consumption without degrading SRAM performance;

It is yet another purpose of the invention to reduce subthreshold leakage in SRAM arrays.

The present invention is an integrated circuit that may include an array such as a static random access memory (SRAM) with gate oxide selectively thickened in the array and in selected other devices based on threshold voltage ($V_T$) variations with gate oxide thickness for the particular technology, e.g., bulk insulated gate FET, bulk CMOS, PD SOI CMOS, fully depleted SOI or double gate CMOS. Some or all array devices may have thicker gate oxide. Thicker oxide may be used in non-core circuits, e.g., test circuits. Also, non-critical paths may be identified and a non-critical path margin identified. A thicker gate oxide is selected for non-critcal path FETs based on the non-critical path margin. Non-critical path delays are re-checked. FETs are formed with the selected thicker gate oxide for any non-critical paths passing the re-check and in array FETs with non-selected FETs being formed with normal gate oxide thickness.

BRIEF DESCRIPTION OF THE DRAWINGS

The foregoing and other objects, aspects and advantages will be better understood from the following detailed preferred embodiment description with reference to the drawings, in which.

DESCRIPTION OF THE PREFERRED EMBODIMENTS

Figure 1:
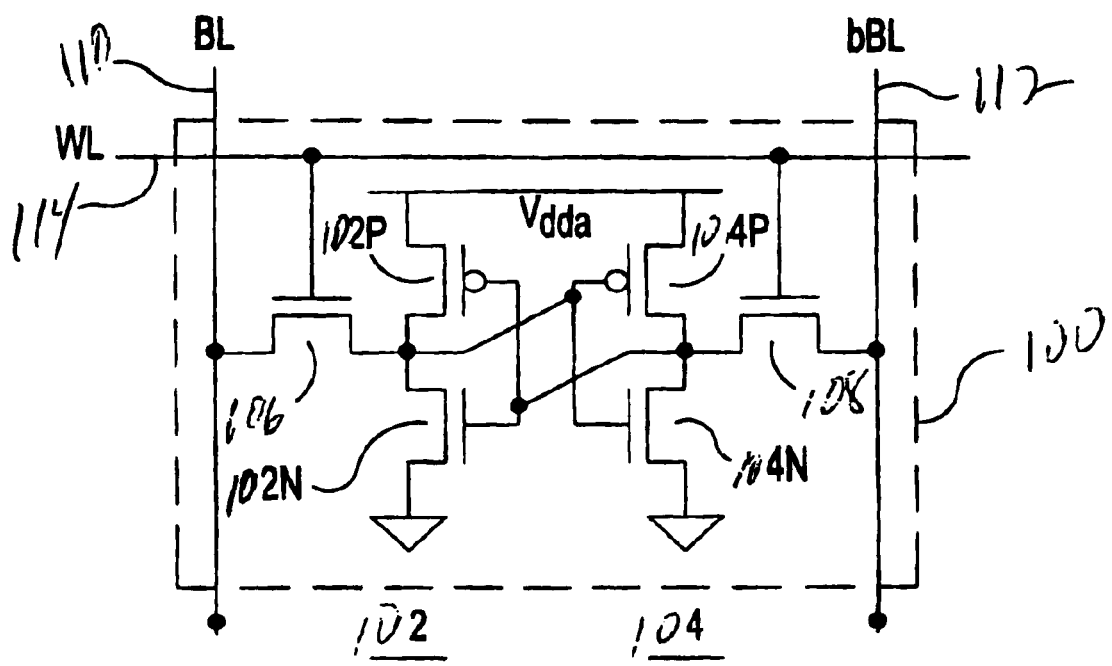
FIG. 1 shows an example of a preferred embodiment six transistor (6T) static random access memory (SRAM) cell.

Turning now to the drawings, and more particularly FIG. 1 shows an example of a preferred embodiment six transistor (6T) storage latch, such as a static random access memory (SRAM) cell 100, in the well-known complementary insulated gate field effect transistor (FET) technology known as CMOS. The technology has a stated design or design rule gate oxide thickness. Preferably, the cell 100 is in what is known as partially depleted (PD) silicon on insulator (SOI) technology. Cell leakage is reduced by selectively providing increasing threshold voltage ($V_T$) to selected cell 100 FET pairs, e.g., by selectively thickening the gate oxide above the stated design gate oxide thickness or by selectively forming the gate oxide for those FETs with a high k dielectric. Thus, by using a suitable high k gate dielectric or by increasing the gate oxide thickness or both, selected device threshold is increased and, accordingly, device leakage is reduced. Examples of high k gate dielectric include $Al_2O_3$, $ZrO_2$, $HfO_2$, $InO_2$, $LaO_2$ and $TaO_2$. These high k metal oxide dielectrics are provided for example only.

It should be noted that description of the present invention herein in terms of CMOS and PD SOI CMOS as applied to SRAMs and SRAM cells is for example only. The present invention has much wider application to almost any type of circuit in any technology including for example silicon based device structures—bulk insulated gate FET, fully depleted SOI, double gate CMOS, strained SiGe. Further, although the preferred embodiments are described hereinbelow with reference to thicker gate oxides, the present invention applies to other methods of selectively increasing threshold voltage or reducing subthreshold leakage such as by using a high k dielectric as noted hereinabove. Thus, for simplicity of description, reference to thicker gate oxide includes such other approaches.

Data is stored in the cell 100 in a pair of cross-coupled inverters 102, 104. The first inverter 102 includes NFET 102N and p-type FET (PFET) 102P series connected between $V_{dd}$ and ground (GND). The second inverter 104 includes NFET 104N and PFET 104P, which are also series connected between $V_{dd}$ and ground. A pair of pass gates 106, 108 are connected between each of the cross coupled inverters 102, 104 and a respective bit line pair 110, 112. A word line 114 connects the pass gates 110, 112 of numerous parallel SRAM cells 100 in a word or word line direction and partially selects the connected SRAM cells. Typically, a common bit line pair 110, 112 connects numerous identical parallel SRAM cells 100 in a bit line or column. Cells 100 in each column are each connected to a different word line to form an SRAM array or subarray. Each cell 100 is addressed/selected by intersection of the word line 114 at a bit line pair 110, 112.

Thus, according to a first preferred embodiment, thicker gate oxide is formed in pairs of devices and, more particularly, pairs of NFETs 102N, 104N and 106, 108. On each side NFETs 102N, 106 and 104N, 108 both have thicker gate oxide and correspondingly, each have an increased threshold voltage ($V_{T+}$) to maintain the signal distribution during read and write operations. Preferably, gate oxide in all four NFETs 102N, 104N, 106 and 108 is identical and is thicker than standard gate oxide thickness on the SRAM chip. Also, since the pass gates 106, 108 have thicker gate oxide, gate capacitance is correspondingly reduced and, likewise word line capacitance, which includes the capacitance of all connected pass gate 106, 108 is reduced. Optionally, in another preferred embodiment PFETs 102P, 104P may have a thicker gate oxide also, that may be identical to that for the NFETs 102N, 104N, 106 and 108. By increasing the gate oxide thickness and so, device thresholds, device leakage is dramatically reduced in each cell 100. Thus, this cell leakage reduction, which is multiplied by the number of cells 100 in the array, translates to a significant power savings for an SRAM macro or, especially, a state of the art SRAM chip.

Figure 2A:
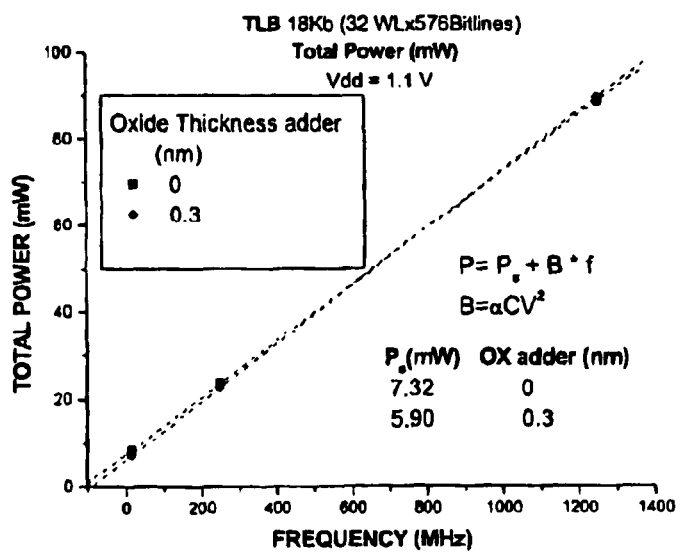
FIGS. 2A–B show an example of performance and power variations with cell gate oxide thickness variation for a cell in a typical state of the art PD SOI CMOS technology.
Figure 2B:
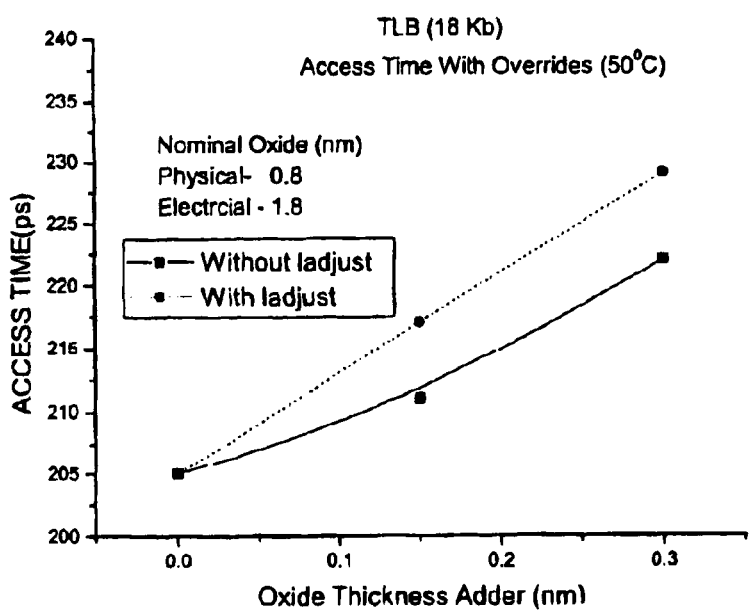

FIGS. 2A–B show an example of performance and power variations with cell gate oxide thickness variation for a cell in a typical state of the art PD SOI CMOS technology. Thus, in this example, although for each 0.1 nm gate oxide thickness increase, cell performance degrades by 4%, leakage is reduced by 8%. Thus, just by selectively thickening array device gate oxide, an 8% improvement may be realized.

However, as noted above, application of the present invention SRAM support circuits and logic circuits in general produces additional power reduction beyond what is realized by reducing SRAM array leakage. In particular, in addition to increasing reducing cell leakage, leakage is similarly reduced in non-array circuits, such as decoders, address and data I/O buffers and in unrelated chip logic as well. Further, the leakage reduction method of the present invention has application to general purpose logic circuits as described hereinbelow. Essentially, device leakage is reduced in any non critical path, e.g., by thickening gate oxide or using high dielectric gate oxide for devices in non-critical paths. So, first, device threshold variation with gate oxide thickness (or for one or more selected high k dielectric) is characterized for the particular technology, e.g., 0.1 μm PD SOI CMOS. Path delays are characterized for the circuit (e.g., SRAM chip, macro, etc.) to identify non-critical paths, i.e., those paths completing well in advance of critical paths and in particular the maximum time available for such completion. A critical path margin is identified based on the margin between critical and non-critical paths. A reduced leakage device (i.e., with thicker gate oxide or a high k dielectric) is selected for FETs in identified non-critical paths based on the critical path margin. Path delays are re-checked to verify the identified non-critical paths with the higher threshold devices. Non-critical path FETs and selected array FETs are formed with the selected high k dielectric or thicker gate oxide and non-selected FETs have normal gate oxide thickness.

Figure 3:
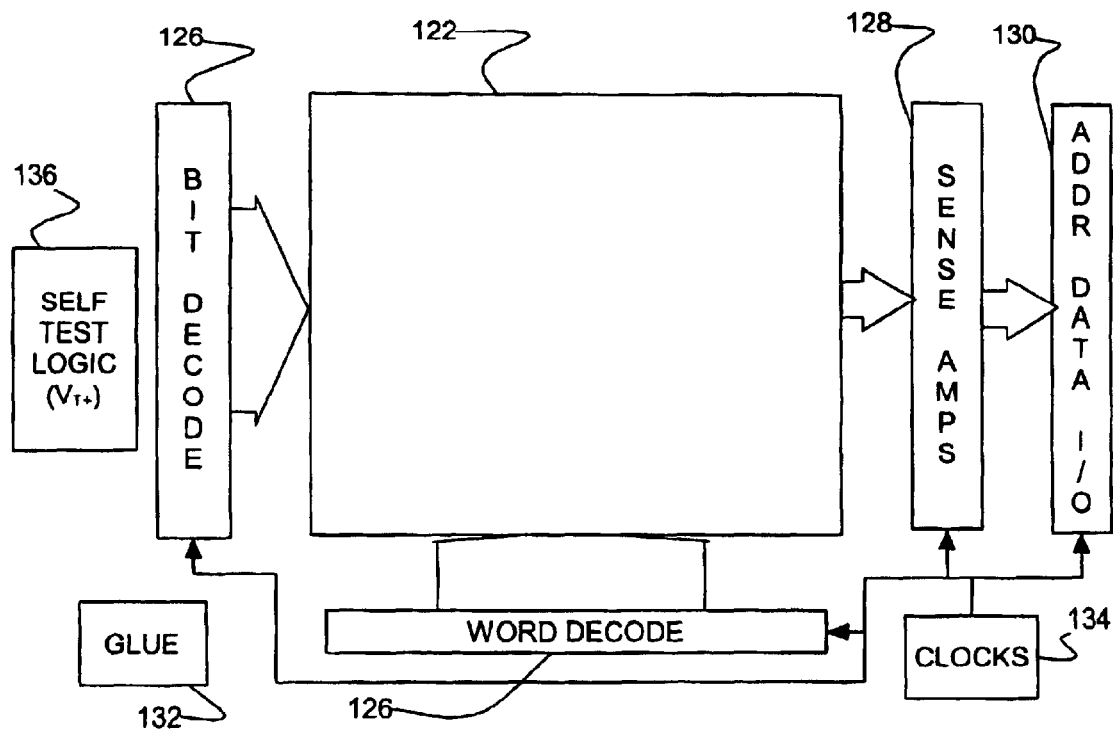
FIG. 3 shows an example of a block diagram of a preferred embodiment SRAM.

FIG. 3 shows an example of a block diagram of a preferred embodiment array 120, e.g., a SRAM chip, a SRAM macro, etc. Thus, the array 120 may be a small part of a much larger, more complex integrated circuit (not shown) and may be a register file or other array. For simplicity of description the array 120 is described as an SRAM. The SRAM 120 includes an array 122 of preferred embodiment cells (100 in FIG. 1). Word decoder 124 and bit decoder 126 select cells within the array 122. Sense amps 128 sense data signals on bit lines (not shown), e.g., connected to bit line pair 110, 112 in FIG. 1. Data and addresses are passed on/off chip through Address/Data I/O 130. RAM chip operation is controlled by glue logic 132 as synchronized/timed by clocks 134. Non-core logic such as self test logic 136 (e.g., scan latches in a scan chain and etc.) is included and active, primarily during chip initialization or start up and, typically operates under much more leisurely constraints. Thus, in this preferred embodiment $V_{T+}$ devices are included only in the array 122 and in the self test logic 136. However, other non-critical paths may exist in the SRAM 120 itself or in other chip circuits. These other non-critical paths are leakage sources that, because they are not part of the array or part of the self test logic 136, are allowed to continue to leak.

Figure 4:
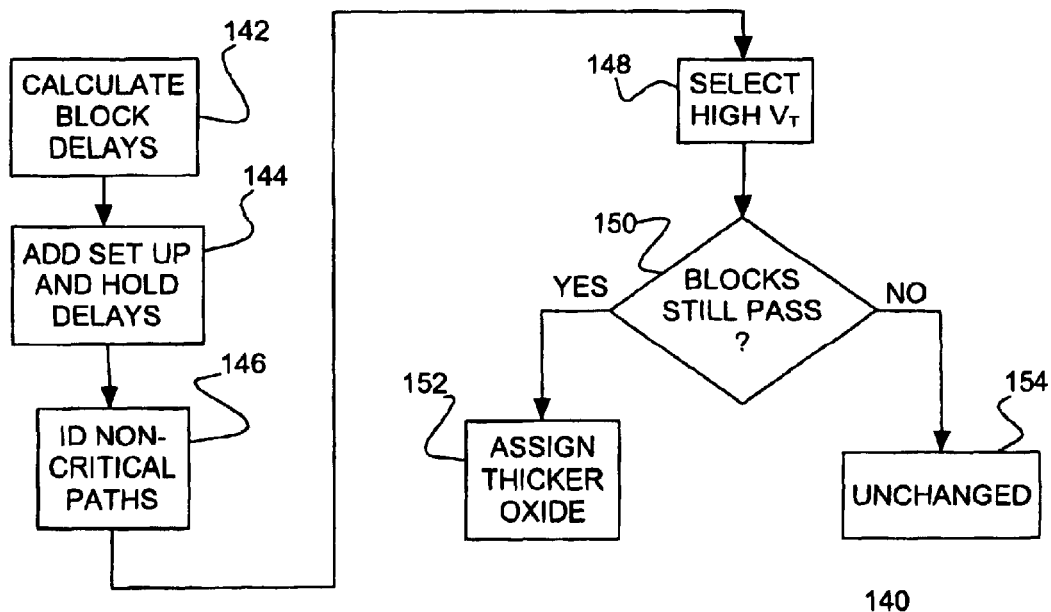
FIG. 4 shows a flow chart for device selection in another preferred embodiment that is a variation on the embodiment of FIG. 3.

FIG. 4 shows a flow chart 140 for device selection in another preferred embodiment that is a variation on the embodiment of FIG. 3, wherein these additional paths are identified and $V_{T+}$ devices are selectively substituted. So, in this preferred embodiment, in addition to the array 122 and self test logic, $V_{T+}$ devices (e.g., thick gate oxide devices) are also selectively formed in non-critical paths, e.g., in the glue logic 132 and, optionally in logic external to the SRAM 120. So, after sufficiently characterizing the manufacturing process, e.g., providing data such as in the examples of FIGS. 2A–B, critical path analysis is run on the SRAM design, e.g., 130 in FIG. 3, beginning in step 142 by calculating the delay through each path, SRAM logic block or each individual circuit. In step 144 set up and hold times are assigned to each latch. In step 146 non-critical paths are identified. In step 148 a $V_{T+}$ device is selected based on the critical path analysis, i.e., the margin in the non-critical paths verses critical paths. In step 150, the results are checked with $V_{T+}$ devices in the non-critical paths and recalculating the delays, especially, early mode and late mode or worst case/best case analysis. In step 152 $V_{T+}$ devices are assigned to each path that passes the timing analysis of step 150 with normal gate oxide used elsewhere. The preferred embodiment chip is fabricated with device gate oxide based upon this assignment. Selecting device gate oxides for $V_{T+}$ devices, reduces device leakage in the non-critical paths to further reduce chip power consumption.

In another more precise embodiment, several $V_{T+}$ devices (e.g., corresponding to several oxide thicknesses) are assigned depending upon the margin available in the identified non-critical paths. Also, such assignment may be done iteratively, selectively assigning gate oxide thickness to individual blocks in selected paths; or, for asymmetric paths (longer in one direction than the other, e.g., longer on a high to low transition than low to high)) thicker oxide may be selected for devices in the shorter path, e.g., at alternating NFETs and PFETs.

Accordingly, cell leakage is reduced for a preferred embodiment SRAM, reducing SRAM power consumption and, especially, SRAM standby power. Further, by tailoring device thresholds for non-critical paths, power savings can be realized in both in non-core circuits and, selectively, in chip core logic and support circuits.

Having thus described preferred embodiments of the present invention, various modifications and changes will occur to a person skilled in the art without departing from the spirit and scope of the invention. It is intended that all such variations and modifications fall within the scope of the appended claims. Examples and drawings are, accordingly, to be regarded as illustrative rather than restrictive.

What is claimed is:

1. An integrated circuit (IC) chip including comprising:
   a plurality of logic paths identified as critical paths, devices in said critical paths having a stated design threshold voltage; and
   a plurality of logic paths identified as non-critical paths, selected devices in said non-critical paths having a design threshold voltage above said stated device design threshold voltage, connected at a first conduction terminal to a first supply voltage and at a second conduction terminal to a storage node.

2. An IC as in claim 1, wherein said devices are field effect transistors (FETs).

3. An IC as in claim 2, wherein said selected FETs have a high k dielectric gate oxide.

4. An IC as in claim 2, wherein said selected FETs have a thicker gate oxide than a stated design gate oxide thickness.

5. An IC as in claim 2, wherein said IC is a CMOS IC, said CMOS IC further including an array of static random access memory (SRAM) cells, each of said SRAM cells comprising:
   a pair of cross-coupled inverters, each of said cross coupled inverters comprising:
      a first NFET having said design threshold voltage, connected drain to source between a storage node and a return voltage, and
      a PFET of a second conduction type, connected drain to source between a storage node and a return voltage, said storage node of the other of said pair of cross-coupled inverters connected to a control terminal of both said first NFET and said PFET; and
   a pair of NFET pass gates having said design threshold voltage, each of said pair of NFET pass gates connected between one said storage node and one of a pair of complementary bit lines.

6. An IC as in claim 5, wherein said IC is on a partially depleted (PD) silicon on insulator (SOI) chip.

7. A static random access memory (SRAM) including an array of SRAM cells, each of said SRAM cells comprising:
   a pair of cross-coupled inverters, each of said cross coupled inverters comprising:
      a first field effect transistor (FET) of a first conduction type having a design threshold voltage above a stated device design threshold voltage, connected at a first conduction terminal to a first supply voltage and at a second conduction terminal to a storage node, and a second FET of a second conduction type, connected at said first conduction terminal to a second supply voltage and at said second conduction terminal to said storage node, a control terminal of both said first field FET and said second FET being connected to said storage node of the other of said pair of cross-coupled inverters; and a pair of FET pass gates of said first conduction type having said design threshold voltage, each of said pair of FET pass gates connected between one said storage node and one of a pair of complementary bit lines.

8. A SRAM array as in claim 7, wherein said first conduction type is N-type and said second conduction type is P-type.

9. A SRAM array as in claim 8, wherein each cell NFET has a high k dielectric gate oxide.

10. A SRAM array as in claim 8, wherein each cell NFET has a thicker gate oxide than a stated gate oxide thickness.

11. A SRAM array as in claim 10, wherein each cell PFET has said thicker design gate oxide thickness.

12. A SRAM array as in claim 11, wherein said SRAM array is on an integrated circuit (IC), FETs in a test circuit on said IC having said thicker design gate oxide thickness.

13. A SRAM array as in claim 12, wherein selected FETs in other circuits on said IC have said thicker design gate oxide thickness.

14. A SRAM array as in claim 13, wherein said selected FETs are in identified non-critical paths.

15. A SRAM array as in claim 13, wherein at least one identified non-critical path is external to said SRAM.

16. A SRAM array as in claim 9, wherein said SRAM array is on a partially depleted (PD) silicon on insulator (SOI) chip.

17. A (CMOS) static random access for memory (SRAM), selected field effect transistors (FETs) having a design threshold voltage ($V_{T+}$) different than a stated design threshold voltage ($V_T$), said SRAM including an SRAM array comprising:

a pair of cross-coupled inverters, each of said cross coupled inverters comprising:
  a first field effect transistor (FET) of a first conduction type having a design threshold voltage ($V_{T+}$) different than a stated design threshold voltage ($V_T$), connected at a first conduction terminal to a first supply voltage and at a second conduction terminal to a storage node, and
  a second FET of a second conduction type, connected at said first conduction terminal to a second supply voltage and at said second conduction terminal to said storage node, a control terminal of both said first FET and said second FET being connected to said storage node of the other of said pair of cross-coupled inverters; and a pair of FET pass gates having the thicker said design threshold voltage ($V_{T+}$), each of said pair of FET pass gates connected between one said storage node and one of a pair of complementary bit lines.

18. A CMOS SRAM as in claim 17, wherein said first conduction type is N-type and said second conduction type is P-type.

19. A CMOS SRAM as in claim 18, wherein each NFET has a thicker design gate oxide thickness than a stated design gate oxide thickness.

20. A CMOS SRAM as in claim 18, wherein design gate oxide thickness in said PFET is said thicker design gate oxide thickness.

21. A CMOS SRAM as in claim 18, wherein FETs in a SRAM test circuit have said thicker design gate oxide thickness.

22. A CMOS SRAM as in claim 21, wherein FETs in at least one other circuit have said thicker design gate oxide thickness.

23. A CMOS SRAM as in claim 22, wherein said selected FETs are in identified non-critical paths in said at least one other circuits.

24. A CMOS SRAM as in claim 22, wherein said SRAM array is on a partially depleted (PD) silicon on insulator (SOI) chip.

25. A circuit design method for minimizing circuit leakage, said method comprising the steps of:
  a) identifying non-critical paths in a design;
  b) identifying a device design threshold above a stated device design threshold for devices in non-critical paths; and
  c) assigning the identified said device design threshold to devices in said non-critical paths.

26. A circuit design method as in claim 25, wherein a design gate oxide thickness is selected to assign said device design threshold, said design gate oxide thickness being thicker than a stated design gate oxide thickness.

27. A circuit design method as in claim 26, wherein the step (b) of identifying the thicker said design gate oxide thickness is selected based on a non-critical path margin.

28. A circuit design method as in claim 27, wherein said circuit includes an SRAM array and the assigning step (c) includes assigning said identified design gate oxide thickness to selected memory cell devices.

29. A circuit design method as in claim 28, wherein said identified design gate oxide thickness is assigned to all memory cell devices.

30. A circuit design method as in claim 29, wherein said identified design gate oxide thickness is assigned to devices in a SRAM test circuit.

31. A circuit design method as in claim 27, wherein the assigning step (c) further comprises substituting devices with said device design threshold in identified said non-critical paths and rechecking for early and late arrival, devices in non-critical paths passing said recheck being assigned said device design threshold.

32. A circuit design method as in claim 31, wherein the step (a) of identifying non-critical paths comprises the steps of:
  i) calculating block delays based on device thresholds corresponding to said stated design gate oxide thickness;
  ii) adding latch setup and hold times based on device thresholds corresponding to said stated design gate oxide thickness; and
  iii) identifying critical paths, all remaining paths being non-critical paths.

33. A circuit design method as in claim 25, wherein a high k oxide is selected to assign said device design threshold.

* * * * *